(12) United States Patent
Tsai et al.

(10) Patent No.: US 6,789,609 B2
(45) Date of Patent: Sep. 14, 2004

(54) HEAT SINK ASSEMBLY STRUCTURE

(75) Inventors: Ching-Feng Tsai, Taipei (TW);
Ping-Tsang Ho, Hsin-Chuang (TW)

(73) Assignee: Datech Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/318,126

(22) Filed: Dec. 13, 2002

(65) Prior Publication Data
US 2004/0040700 A1 Mar. 4, 2004

(30) Foreign Application Priority Data
Aug. 27, 2002 (TW) .......................................... 91213373

(51) Int. Cl.[7] ................................................ H05K 7/20
(52) U.S. Cl. ...................... 165/78; 165/79; 165/80.3; 165/185; 174/16.3; 257/722; 361/704
(58) Field of Search ............................. 165/80.3, 185, 165/78, 79; 174/16.3; 257/722; 361/704

(56) References Cited
U.S. PATENT DOCUMENTS

| 2,434,676 | A | * | 1/1948 | Spender | 165/80.3 |
| 5,558,155 | A | * | 9/1996 | Ito | 165/80.3 |
| 6,104,609 | A | * | 8/2000 | Chen | 165/80.3 |
| 6,336,498 | B1 | * | 1/2002 | Wei | 165/80.3 |
| 6,449,160 | B1 | * | 9/2002 | Tsai | 165/80.3 |
| 6,474,407 | B1 | * | 11/2002 | Chang et al. | 165/80.3 |
| 6,607,023 | B2 | * | 8/2003 | Ho et al. | 165/78 |
| 6,607,028 | B1 | * | 8/2003 | Wang et al. | 165/185 |
| 6,619,381 | B1 | * | 9/2003 | Lee | 165/78 |
| 2002/0112846 | A1 | | 8/2002 | Noda et al. | |

* cited by examiner

Primary Examiner—Leonard Leo
(74) Attorney, Agent, or Firm—Troxell Law Office PLLC

(57) ABSTRACT

The present invention relates to a heat sink assembly structure having at least a heat sink fastening member combined with at least a heat sink. Each heat sink fastening member has a V-shaped protrusion, a slot, and an elastic lock member. The elastic lock member has a V-shaped cross sectional structure. The V-shaped protrusion of a first heat sink is combined tightly in the slot of a second heat sink for assembling the heat sink and for forming a V-shaped slot. The assembled heat sink is fixed in a base by adding a solder into the V-shaped slot.

6 Claims, 11 Drawing Sheets

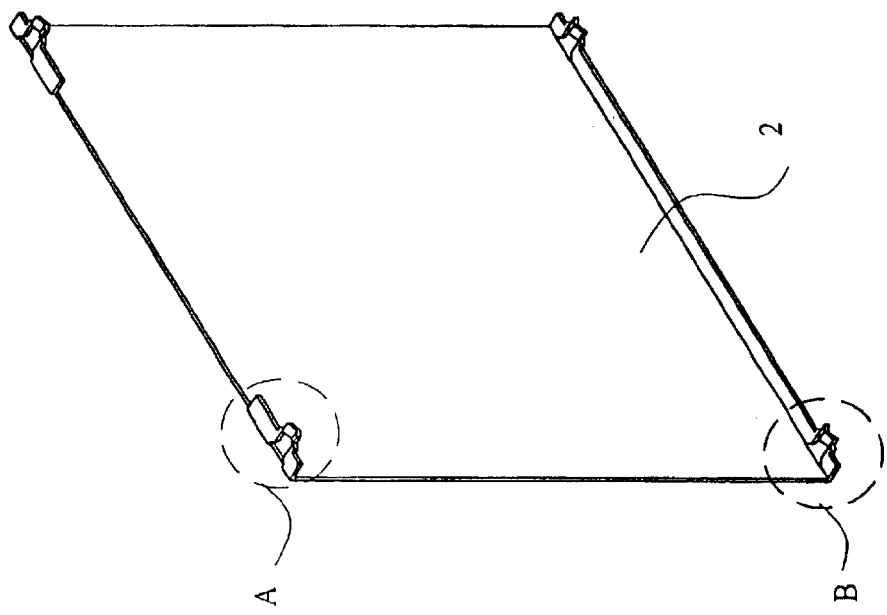

HEAT SINK ASSEMBLY STRUCTURE

REFERENCE CITED

Pub. No. U.S. 2002/0112846 A1

FIELD OF INVENTION

The present invention relates to a CPU heat sink assembly structure, and more particularly, to a fastening member structure of fixed heat sinks and a method for combining a heat sink assembly with a base.

BACKGROUND OF THE INVENTION

A central processing unit (CPU) is a very important component for a computer and computer technology is improving all the time, which is resulting in a higher clock speed and efficiency. Because of these improvements the heat dissipated is greater than before. The present invention is a heat sink assembly structure. By combining at least a heat sink fastening member, a lower temperature and heat dissipation are achieved.

In general, there are two types of heat sink assemblies for CPUs. One is a packed aluminum heat sink, which is processed so that the heat sink and the base from a single piece (referring to FIG. 1A): The other one is an assembled heat sink, which uses several heat sink fastening members to assemble several heat sinks together (FIG. 1B).

In FIG. 1A, the packed aluminum type of the conventional heat sink is a processed single piece packed aluminum, combining a heat sink 1a and a base 1b as a single piece. However, due to the limitation of one-piece technology, each heat sink 1a is a slightly thicker, and intervals d within the heat sink assembly are wider. Thereby reducing the number of the heat sinks 1a, and lessening the heat dissipation effect.

Referring to FIG. 1B, the conventional assembled type heat sink uses several heat sink fastening members 10 to combine several heat sinks 1. The heat sink fastening member 10 uses a hook 11 and a hole 12 to hook the heat sinks 1 together. However, this fastening manner only operates when positioned horizontally. The heat sinks 1 easily separate if positioned vertically, which causes assembly problems.

Since the heat sink assembly needs to be soldered to the base after assembled, its compactness is very important since resistance of heat dissipation will increase, resulting in decrease of heat dissipation efficiency of the overall heat dissipation devices.

Without the above shortcomings, the present invention provides a heat sink assembly for heat dissipation that is easy to assemble, and has a low heat resistance and high efficiency. Especially, the fastening member for fastening the heat sink is improved and the structure of a V-shaped slot is added.

SUMMARY OF THE INVENTION

The main objective of the present invention is to develop a heat sink assembly structure, which is good for heat dissipation and assembles easily and securely.

Another objective of the present invention is to provide an elastic lock member, supplying certain flexibility in the slot to prevent separation when positioned horizontally or vertically during assembling.

Still another objective of the present invention is to provide a V-shaped slot in the heat sink assembly and to fix the heat sink in a base by adding solder at the V-shaped slot.

Specifically, the present invention provides a type of heat sink assembly structure refinement, using at least a heat sink fastening member combined with at least a heat sink, wherein the heat sink fastening member has a V-shaped protrusion, a slot, and an elastic lock member. The elastic lock member has a V-shaped cross sectional structure. The V-shaped protrusion is combined tightly in the slot for assembling the heat sink and for forming a V-shaped slot. The assembled heat sink is fixed in a base by adding a solder into the V-shaped slot.

BRIEF DESCRIPTION OF THE DRAWINGS

The preset invention will be better understood from the following detailed description of preferred embodiments of the invention, taken in conjunction with the accompanying drawings:

FIG. 2A shows a perspective diagram of the heat sink assembly of the present invention;

DETAILED DESCRIPTION OF THE INVENTION

To achieve the above-described objectives of the present invention, techniques, methods, specific characteristics and configuration of the present invention will be fully explained as discussed below and with the accompanying drawings.

Figure 1A:
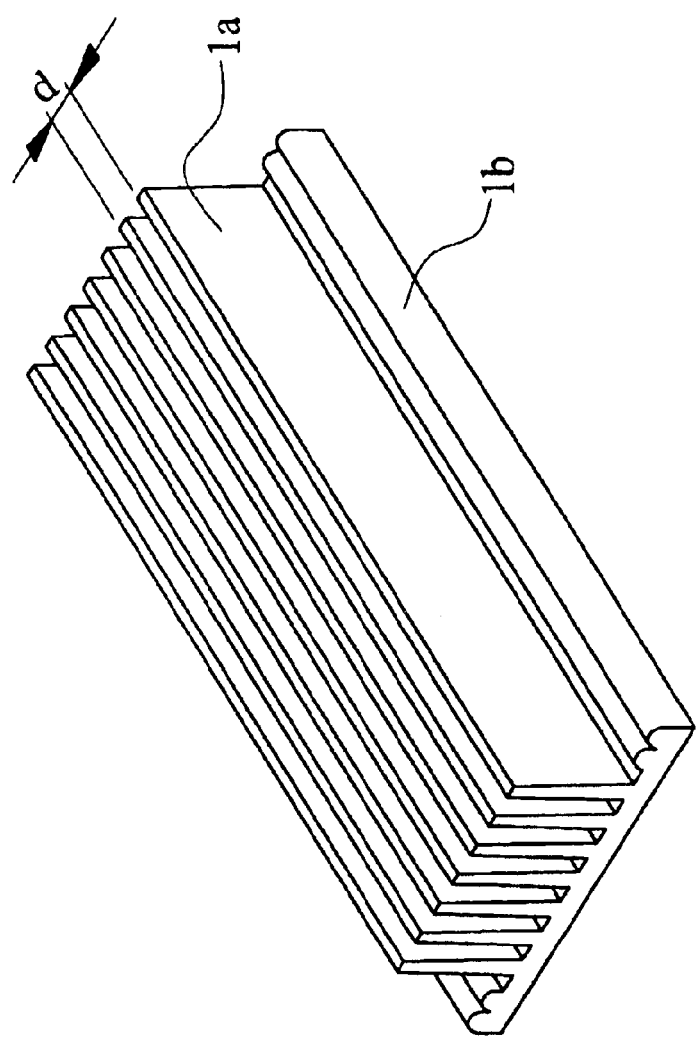
FIG. 1A shows a perspective diagram of the conventional heat sink assembly.
Figure 1B:
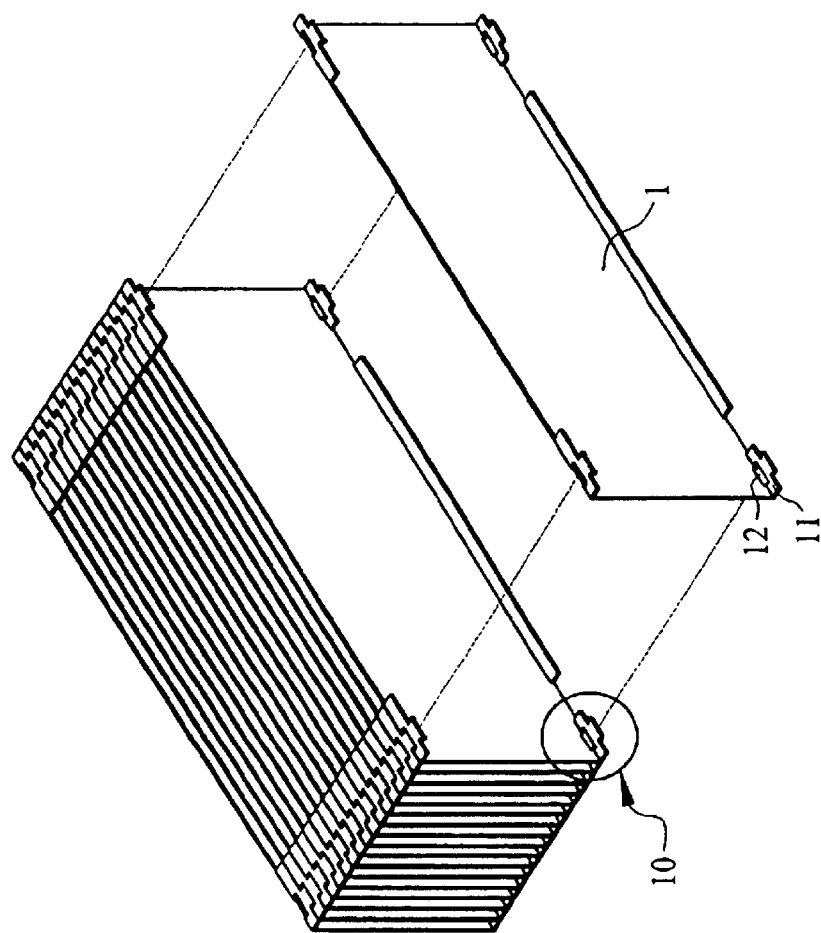
FIG. 1B shows a perspective diagram and a partial magnification diagram of a fastening configuration of the conventional heat sink assembly.
Figure 1C:
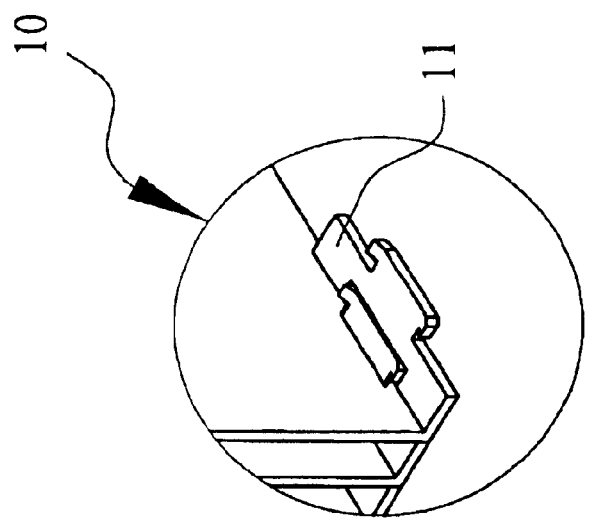
FIG. 1C shows a enlarged view of area 10 of FIG. 1B.
Figure 2B:
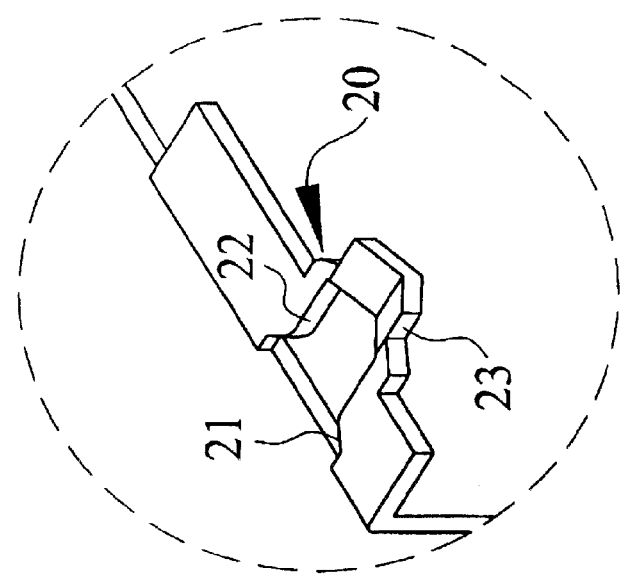
FIG. 2B shows an enlarged view of area A of FIG. 2A.
Figure 2C:
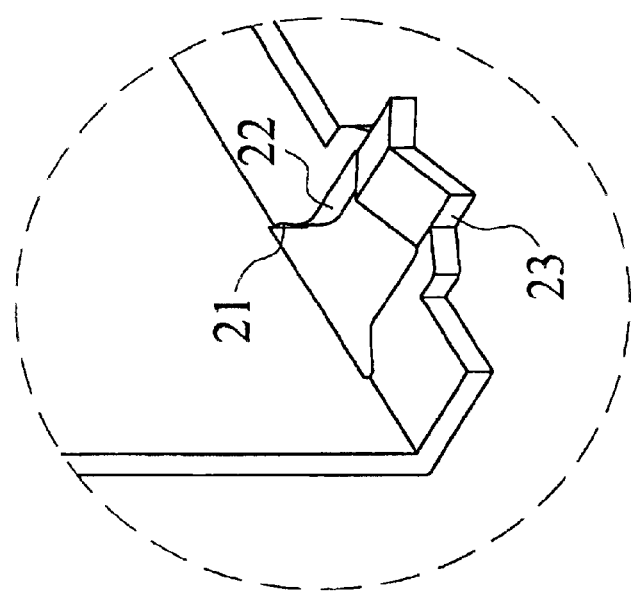
FIG. 2C shows an enlarged view of area B of FIG. 2A.
Figure 3A:
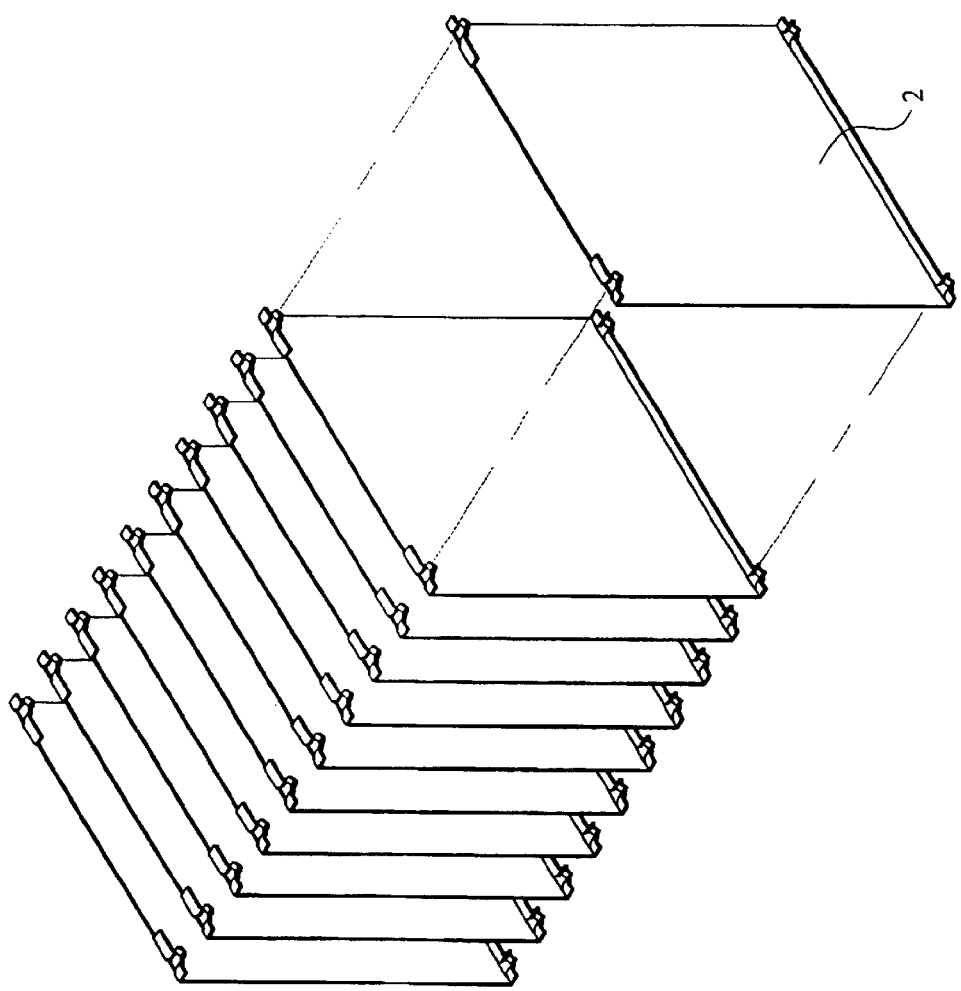
FIG. 3A shows a perspective diagram in a fastening configuration of the heat sink assembly before assembled of the present invention.
Figure 3B:
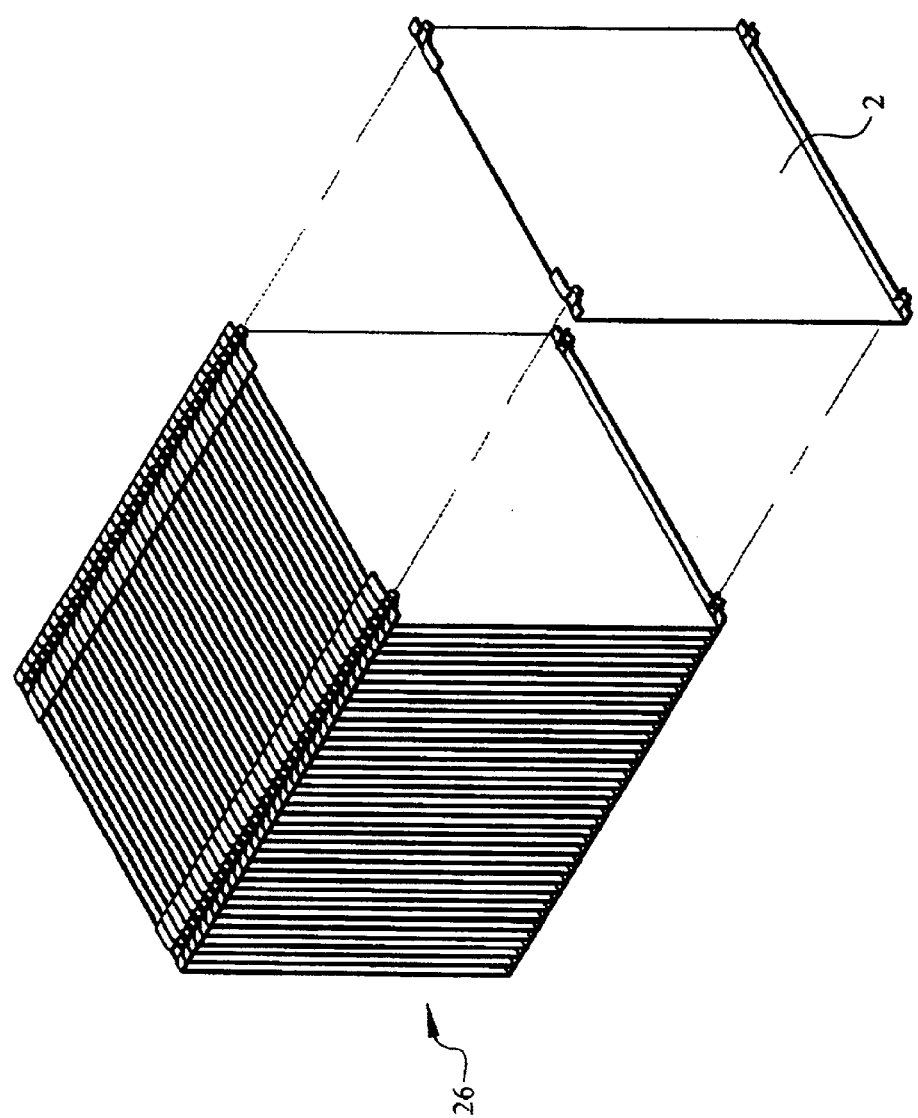
FIG. 3B shows a perspective diagram in a fastening configuration of the heat sink assembly after assembled of the present invention.

Referring to FIG. 2, a heat sink assembly structure is shown having at least a heat sink fastening member 20 combined with at least a heat sink 2, to provide heat dissipation (referring to FIG. 3B for a combination configuration). The heat sink fastening member 20 has a V-shaped protrusion 21, a slot 22, and an elastic lock member 23. The elastic lock member 23 has a V-shaped cross sectional structure. The V-shaped protrusion 21 of a first heat sink is combined tightly in the slot 22 of a second heat sink to connect the adjacent heat sinks 2 and to form a V-shaped slot 24. The assembled heat sink is fixed in a base 25 by adding a solder into the V-shaped slot 24. In a preferred embodiment, a width of a side of the heat sink of the present invention is substantially about 57.5 mm. During assembly of the heat sink 2, as shown in the FIG. 3A, the elastic lock member 23 has a V-shaped cross sectional area with elastic structure. The elasticity coefficient (k) of the material can be calculated by using the equation below, which corresponds with the elastic lock member displacement angle $\Delta\theta$ to generate a required elastic force F.

$F=k\Delta\theta$

From the above equation, it is determined that when the material with a constant material elastic coefficient k, is chosen, the required displacement angle $\Delta\theta$ can be set according to the required elastic force, to form the heat sink 2. Thus, after assembled, the heat sink will not come off horizontally and vertically and will be completely fastened, as shown in FIG. 3B.

The heat sink fastening member 20 of the present invention is located on top and bottom side ends of the heat sink 2 (that is, four corners of the heat sink 2). Accordingly, the heat sink 2 can be held tightly, and will come off easily, as in FIG. 3B. In the present invention, though four heat sink fastening members are used in the preferred embodiment, those persons skilled in the art may re-combine, add, or delete the fastening members with reference to the present invention to achieve similar effects.

Figure 4A:
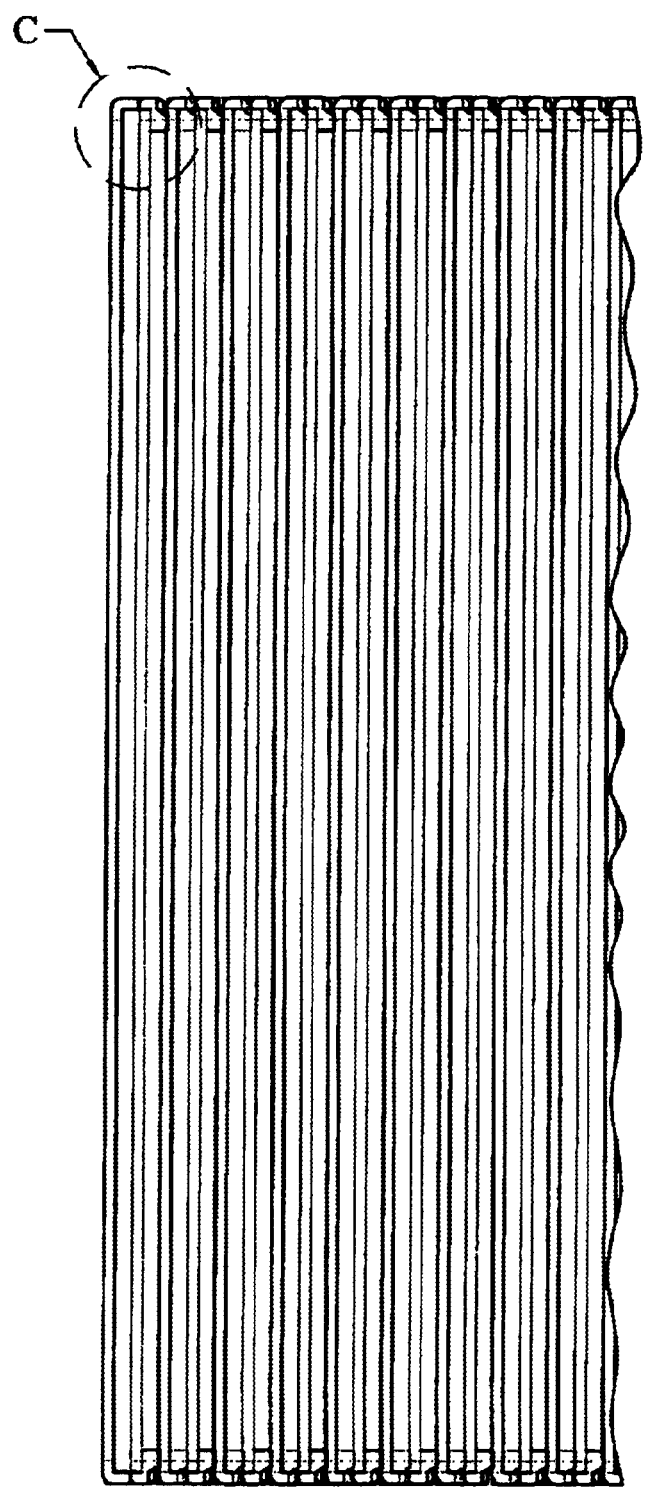
FIG. 4A shows a perspective partial diagram in a side view in a fastening configuration of the heat sink assembly of the present invention.
Figure 4B:
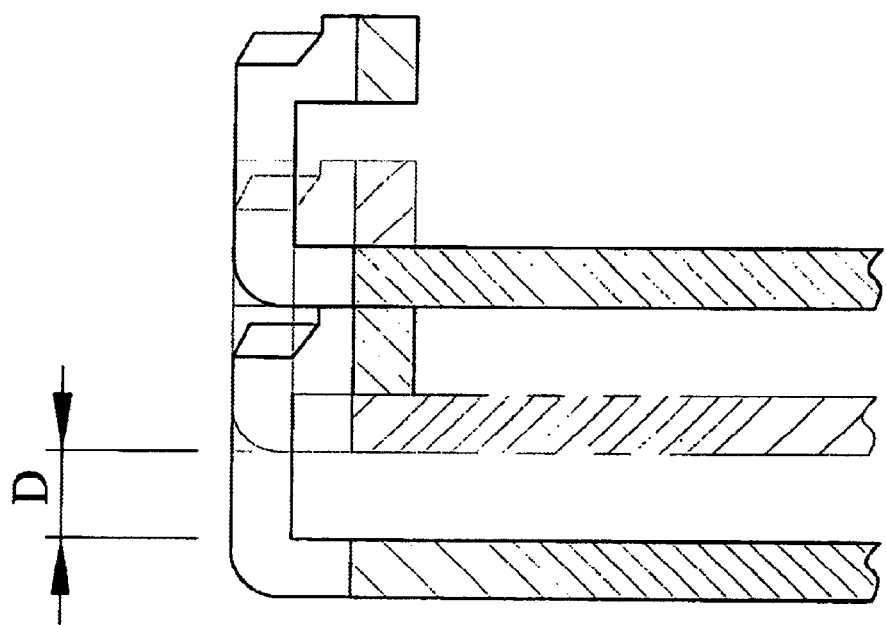
FIG. 4B shows an enlarged view of area C of FIG. 4.

Further referring to FIG. 4B, the combination of the elastic lock member 23 and the slot 22 forms at least an interval D between two adjacent heat sinks 2. Moreover, the width of the interval is substantially less than 2 mm. Hence, more heat sinks 2 can be combined together for increasing the heat dissipating surface area.

Figure 5:
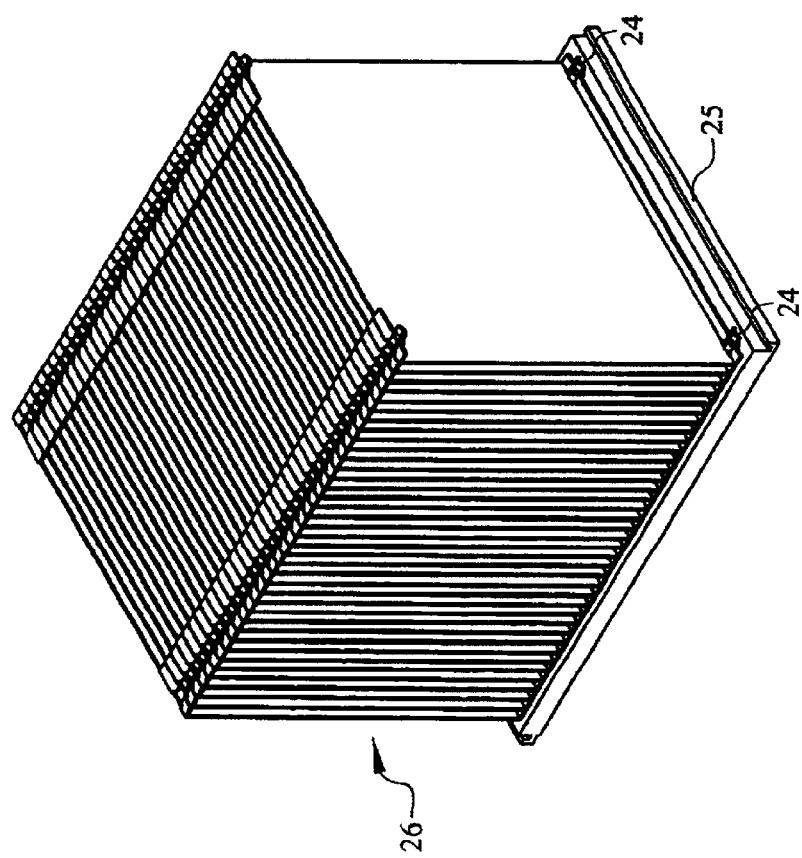
FIG. 5 shows a perspective diagram of a combination of a heat sink assembly and a base of the present invention.

Further referring to FIG. 5, a perspective diagram in a combination configuration with the heat sink assembly 26 and the base 25 is shown. The heat sink assembly 26 with the elastic lock member 23 and the slot 22 combine with each other to form a V-shaped slot 24. The heat sink assembly 26 and the base 25 are combined together by adding solder into the V-shaped slot 24 so as to lower the resistance of the overall heat dissipation and increase the heat dissipation efficiency.

The present invention has been described above with reference to a preferred embodiment. However, it is not a limitation in the invention. Various changes, modifications, and enhancements could be made therein without departing from the scope of the invention as set forth in the following claims.

What is claimed is:

1. A heat sink assembly structure comprising:
   a plurality of heat sinks, each heat sink having a plurality of heat sink fastening members, each heat sink fastening member having:
   a) a V-shaped protrusion;
   b) a slot; and
   c) an elastic lock member having a V-shaped cross-sectional configuration;
   wherein each V-shaped protrusion of a first heat sink is inserted into one slot of a second heat sink to attach the first and second heat sinks together.

2. The heat sink assembly structure according to claim 1, wherein said plurality of heat sink fastening members are located on top and bottom side ends of each of the plurality of heat sinks.

3. The heat sink assembly structure according to claim 1, wherein the combination of said elastic lock member and said slot of two adjacent heat sinks of the plurality of heat sinks forms an interval between said heat sinks.

4. The heat sink assembly structure according to claim 1, wherein said elastic lock member and said slot are combined to connect two adjacent heat sinks of the plurality of heat sinks.

5. The heat sink assembly structure according to claim 3, wherein a width in a side of said heat sink is 57.5 mm.

6. The heat sink assembly structure according to claim 3, wherein said interval is less than 2 mm.

* * * * *